US012082385B2

(12) United States Patent
MacFadden et al.

(10) Patent No.: US 12,082,385 B2
(45) Date of Patent: Sep. 3, 2024

(54) ELECTROSTATIC DISCHARGE (ESD) MITIGATION FOR IN-EAR AUDIO OUTPUT DEVICES

(71) Applicant: BOSE CORPORATION, Framingham, MA (US)

(72) Inventors: Todd William MacFadden, Brookline, MA (US); Landon Airey, Boston, MA (US); Colleen Salvaggi, Norton, MA (US); Donna Marie Sullivan, Millbury, MA (US); Richmond Andrew Real, Uxbridge, MA (US); Traci Walz, Westminster, CO (US)

(73) Assignee: BOSE CORPORATION, Framingham, MA (US)

( * ) Notice: Subject to any disclaimer, the term of this patent is extended or adjusted under 35 U.S.C. 154(b) by 300 days.

(21) Appl. No.: 17/662,394

(22) Filed: May 6, 2022

(65) Prior Publication Data

US 2023/0363125 A1    Nov. 9, 2023

(51) Int. Cl.
| | |
|---|---|
| *H04R 1/00* | (2006.01) |
| *H04R 1/04* | (2006.01) |
| *H04R 1/10* | (2006.01) |
| *H05K 1/18* | (2006.01) |
| *H05K 9/00* | (2006.01) |

(52) U.S. Cl.
CPC ............ *H05K 9/0067* (2013.01); *H04R 1/04* (2013.01); *H04R 1/1016* (2013.01); *H05K 1/189* (2013.01)

(58) Field of Classification Search
CPC ...... G01J 1/0411; G01J 1/4204; H02J 7/0045; H04R 1/1016; H04R 1/1025; H04R 1/1058; H05K 5/0004; H05K 5/0086; H05K 5/0091; B29C 45/14336; B29C 45/16; B29K 2055/02
See application file for complete search history.

(56) References Cited

U.S. PATENT DOCUMENTS

| 2013/0343564 A1* | 12/2013 | Darlington ........... H04R 1/1083 381/74 |
| 2017/0164093 A1* | 6/2017 | Silvestri ............... H04R 1/1016 |
| 2019/0165456 A1* | 5/2019 | Elghannai ............... H01Q 7/00 |

* cited by examiner

*Primary Examiner* — Pete T Lee
(74) *Attorney, Agent, or Firm* — Patterson + Sheridan, LLP (57) ABSTRACT

Aspects describe an in-ear audio output device for ESD mitigation. The device includes an earbud housing, a nozzle having one or more apertures to conduct sound waves to the ear canal of the wearer, a flexible printed circuit board positioned within the earbud housing and the nozzle, the flexible printed circuit board comprising: a first portion, a second portion comprising a first edge of the flexible printed circuit board proximate the one or more apertures, and a metal layer on a top surface of the second portion, a microphone attached to a bottom surface of the flexible printed circuit board, and a metal casing attached to the bottom surface of the flexible printed circuit board and surrounding the microphone, the metal casing comprising a second edge proximate the one or more apertures, wherein the second edge is a greater distance from the one or more apertures than the first edge.

11 Claims, 4 Drawing Sheets

ELECTROSTATIC DISCHARGE (ESD) MITIGATION FOR IN-EAR AUDIO OUTPUT DEVICES

FIELD

Aspects of the present disclosure describe various features of an in-ear audio output device having electrostatic discharge (ESD) protection.

BACKGROUND

In-ear audio output devices, for example earbuds, employ earphones that can be disposed in the lower concha area of a user's ear. Such devices can be used for delivering music, radio, telephonic communication, and/or other audio to the user.

Earbuds are used in a variety of environments, including static-filled environments which encourage static electricity buildup. For example, very low humidity (e.g., dry) environments and very windy environments are conducive for static buildup. Further, normal activities of a user (e.g., such as jogging or exercising) and/or clothing worn by a user (e.g., clothes made with synthetic fibers) can also cause a buildup of static electricity. If the amount of charge that develops is large enough, an electrostatic discharge (ESD) event may occur.

ESD is the sudden and momentary electrical current that flows between two objects at different electrical potentials. These momentary electrical currents may disturb or cause damage to circuit assemblies, such as printed circuit boards (PCBs), and other objects that are sensitive to ESD inside the earbud. In particular, during an ESD event, charge buildup is released which may produce a spark that is felt by the user or may produce an audible crackle as the charge interacts with audio components within the earbud. Further, the ESD event may cause damage to metal components inside the earbud. It is desirable to reduce the occurrence of ESD events in earbuds.

SUMMARY

Aspects provide an in-ear audio output device. In an aspect, the in-ear audio output device comprises: an earbud housing; a nozzle coupled to an external surface of the earbud housing and configured to extend towards an ear canal of an ear of a wearer of the in-ear audio output device and comprising a planar, distal end having one or more apertures to conduct sound waves to the ear canal of the wearer; a flexible printed circuit board positioned within the earbud housing and the nozzle, the flexible printed circuit board comprising: a first portion; a second portion comprising a first edge of the flexible printed circuit board proximate the one or more apertures; a metal layer on a top surface of the second portion extending, at least, to the first edge of the flexible printed circuit board; and a first coverlay on a top surface of a portion of the metal layer of the flexible printed circuit board, the first coverlay comprising a second edge proximate the one or more apertures, wherein the second edge is a greater distance away from the one or more apertures than the first edge; and a microphone surrounded by a metal casing attached to a bottom surface of the flexible printed circuit board, the metal casing comprising a third edge proximate the one or more apertures, wherein the third edge is a greater distance from the one or more apertures than the first edge.

In aspects, the third edge is a greater distance away from the one or more apertures than the second edge.

In aspects, the flexible printed circuit board further comprises a second coverlay on a bottom surface of the flexible printed circuit board and the microphone surrounded by the metal casing is attached to the second coverlay. In aspects, the first coverlay and the second coverlay comprise polyimide.

In aspects, the metal layer comprises a copper layer.

In aspects, the metal layer is electrically grounded.

In aspects, the in-ear audio output device further comprises a metal stiffener on a top surface of the first coverlay of the flexible printed circuit board comprising a fourth edge proximate the one or more apertures, wherein the fourth edge is a greater distance away from the one or more apertures than the first edge. The fourth edge may be a same distance away from the one or more apertures as the second edge.

In aspects, a length of the metal casing surrounding the microphone is less than a length of the second portion of the flexible printed circuit board; and the metal casing surrounding the microphone is centered on the bottom surface of the flexible printed circuit board such that the first edge of the flexible printed circuit board and the third edge of the metal casing are separated by a distance.

In aspects, the in-ear audio output device further comprises a metal mesh near the one or more apertures, wherein the metal mesh minimizes or reduces an electrostatic discharge entering through the one or more apertures.

In aspects, the in-ear audio output device further comprises a substantially spherical dome shaped sealing structure extending from the planar, distal end of the nozzle.

All examples and features mentioned herein can be combined in any technically possible manner. Other features, objects, and advantages will become apparent from the following detailed description, when read in connection with the following drawing.

DETAILED DESCRIPTION

Aspects described herein provide an in-ear audio output device having ESD protection. More specifically, to avoid undesirable ESD events, an electrically conductive metal of a printed circuit board (PCB) within an in-ear audio output device may be used for purposes of diverting undesirable charge away from ESD sensitive components within the in-ear audio output device.

One example of an in-ear audio output device is an earbud. Earbuds may be prone to ESD events. For example, an ESD event may occur where a person touches an earbud (e.g., wireless earbud) while outside the person's ear. Where the person and the earbud are at different voltage potentials, an ESD event may occur. More specifically, during the ESD event, accumulated static charge (e.g., electrical charge caused by an imbalance of electrons) may have a high enough voltage to leap from the person to metal components within the earbud, thereby discharging the static electricity into the earbud. In particular, a metal component situated within the earbud a distance closest to an opening of the earbud (e.g., closest to the outside world) may be more at risk of experiencing the ESD event.

In another example, the person may be wearing wired earbuds (e.g., earbuds connected to an audio device via a cord). During an ESD event, while the person is wearing the earbuds, static charge may build up at the person's ear. The accumulated static charge may transfer from the user's ear to metal components within the earbud, thereby discharging the static electricity into the earbud.

In either scenario, the earbud may contain an earbud housing and a nozzle coupled to an external surface of the earbud housing. The nozzle may be configured to extend towards an ear canal of an ear of a wearer of the earbud and include an opening for conducting sound waves to the wearer's ear canal (e.g., the outside world), when placed in the wearer's ear. The earbud may further contain a flexible PCB, also referred to as FPC or flex circuit for short, which may be a single-layer or a multi-layer structure having metal layers separated by polyimide dielectric materials. Further, the earbud may contain a microphone surrounded by a metal casing mounted to one side (e.g., a bottom side) of the FPC. Where the metal casing surrounding the microphone is positioned within the nozzle as the closest metal material to the opening of the nozzle, the metal casing, and therefore the microphone within, may be most at risk of experiencing ESD. In other words, where the edge of the microphone casing near the opening is the closest metal to the outside world, the metal casing may be the point at which an ESD strike will terminate. The microphone surrounded by the metal casing may be become damaged as a result of such an ESD strike. Although aspects described herein are described with respect to a microphone positioned within a nozzle of the earbud, similar issues may occur with other metal components (e.g., including other microphones) positioned within the earbud, or another device, as the closest metal to the outside world.

In some cases, to avoid undesirable ESD strikes at the microphone, some earbud designs utilize a metal stiffener, where the metal stiffener may be made of, for example, stainless steel, aluminum, Kovar, titanium, and/or the like. The metal stiffener may be added on one side (e.g., a top side) of the FPC such that the metal stiffener is situated on an opposite side of the FPC from the microphone (e.g., the metal stiffener may be on a top side of the FPC, while the microphone, surrounded by the metal casing, may be on a bottom side of the FPC). Use of the metal stiffener in the earbud design positioned on the opposite side of the FPC from the microphone may help to divert an ESD strike away from the metal casing surrounding the microphone. Ideally, the metal stiffener may be positioned closer to an opening of the earbud (e.g., the nozzle opening), thus ensuring that the metal stiffener is the closest metal component to the outside world. However, ensuring a position of the metal stiffener relative to the FPC with tight enough tolerances such that the metal stiffener is guaranteed to be the closest metal to the outside world proves to be challenging.

For example, FPC depaneling, also called singulation, is the process of removing numerous smaller, individual FPCs from a larger multi-FPC panel produced during manufacturing. A punching system may be used for singulating such FPCs. In mass production, however, FPC and metal stiffener punching may not occur together; thus, after punching each FPC, each metal stiffener may be placed on one side, for example, a first side of each of the FPCs. Unfortunately, an edge of the metal stiffener, when placed on the first side of the FPC, may not align with an edge of the FPC (e.g., the edge closest to the opening of the earbud) and instead be offset by a nominal distance (e.g., approximately 0.2-0.4 millimeters (mm) from the edge of the FPC). The offset may depend upon the accuracy of the placement of the metal stiffener on the first side of the FPC. Accordingly, the offset of the metal stiffener may be greater where placement accuracy is low, thereby causing, in some cases, the stiffener to be a further distance away from the nozzle opening than the metal casing surrounding the microphone. In such a case, static charge entering the earbud may reach the metal casing first, as the metal casing is the metal closest to the outside world, as opposed to the metal stiffener.

In some other cases, to avoid undesirable ESD strikes at the microphone, some earbud designs introduce a metal mesh on a top side of the metal stiffener positioned on the FPC and extended to an edge of the FPC. The metal mesh helps to divert undesirable charge away from the metal casing surrounding the microphone, as the location of the metal mesh is positioned such that the metal mesh is the closest material to the opening. However, the introduction of the metal mesh within the earbud constricts airflow within the earbud thereby, in some cases, making the earbud less desirable for a variety of acoustic reasons.

Accordingly, aspects of the present disclosure provide an in-ear audio output device having an electrically conductive metal layer of an FPC positioned within the in-ear audio output such that the metal layer of the FPC is a closest metal to the nozzle opening of the earbud (e.g., a closest metal within the device to the outside world). The metal layer helps to protect the microphone within the in-ear audio output device from an ESD strike by diverting undesirable static charge which enters the device away from the microphone. The metal layer may be electrically grounded such that a static charge attracted to the metal layer terminates at the metal layer after entering the in-ear audio output device. Further, the metal layer may be a top layer of the existing FPC such that an accurate placement of a metal stiffener on the FPC is irrelevant, unlike solutions where a metal stiffener is used as the sole means of protecting the microphone from an ESD strike, as described above.

Traditionally during manufacturing, the metal layer of an FPC is pulled back from an edge of the FPC prior punching, to avoid tearing the metal layer when the FPC is punched out of the FPC panel (i.e., singulated). Thus, the metal layer may not extend to the edge of the FPC and, accordingly, may not be a metal within the in-ear audio output device closest to the outside world. However, according to aspects described herein, a two-stage singulation process may be performed whereby the metal layer is cut with a laser prior to punching, thereby preventing tearing. Other methods of manufacture may also be considered to allow the metal layer to extend to the edge of the FPC.

Although aspects herein are described with respect to an in-ear audio output device, certain aspects may apply to other types of devices for purposes of protecting ESD sensitive components within such devices from an ESD strike.

Figure 1:
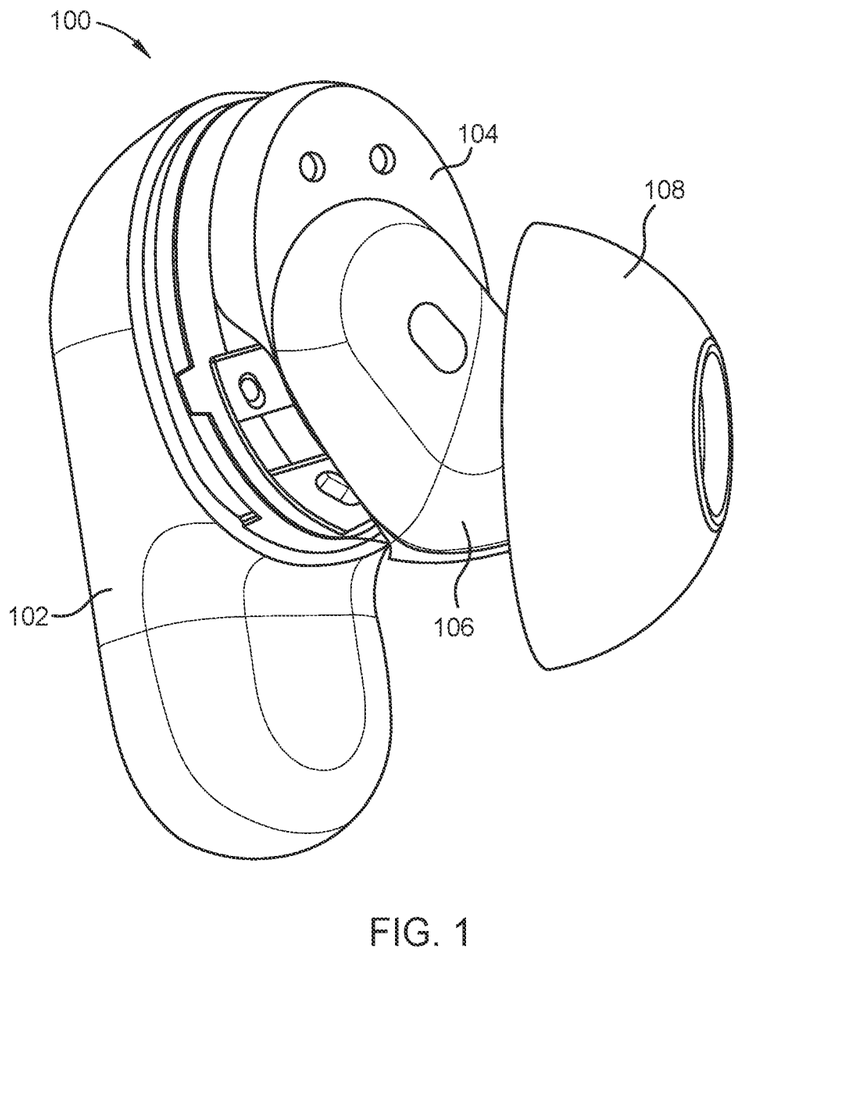
FIG. 1 is a side perspective of an in-ear audio output device, according to aspects of the present disclosure.

FIG. 1 is a side perspective 100 of an in-ear audio output device. The in-ear audio output device (referred to herein as the "audio device") includes a body 102, an earbud housing 104, a nozzle 106, and a sealing structure 108. In aspects, earbud housing 104 is shaped to fit in and around a lower concha of a wearer of the audio device. Earbud housing 104 defines an acoustic chamber which houses an acoustic driver and other electronics for the audio device.

Body 102 is coupled to an external surface of earbud housing 104 extending away from an ear canal of the ear of the wearer. In aspects, body 102 is shaped like a rectangular pill and is situated outside the wearer's ear when the audio device is worn. In aspects, body 102 sits against the outside of the wearer's ear, and in some cases, the wearer's face, to help hold the audio device in place in the ear.

Nozzle 106 extends from earbud housing 104 towards sealing structure 108. In aspects, earbud housing 104 extends into nozzle 106, or in other words, forms part of nozzle 106. Nozzle 106 includes an acoustic passage for sound waves to pass to the ear canal of the wearer. In aspects, nozzle 106 has a planar end with a substantially elliptical-shaped opening. A major axis of the substantially elliptical-shaped opening is substantially aligned with a major axis of the wearer's ear canal when the audio device is positioned in the wearer's ear. In certain other aspects, the opening is oval shaped or racetrack shaped. In aspects, nozzle 106 has a planar end with one or more smaller openings.

Sealing structure 108 creates a seal with a typical wearer's ear canal. Sealing structure 108 is substantially spherically-dome shaped. Sealing structure 108 extends from the planar end of nozzle 106 and folds back towards the wearer's outer ear. Sealing structure 108 includes a narrow end coupled to nozzle 106 and a wider end that is larger than a typical ear canal is wide. There may be a soft, round connection between the narrow end of sealing structure 108 and the wider end of sealing structure 108. In an example, the connection between the narrow end and the wider end is described as pillow-shaped, dome-shaped, soft, and/or slightly curved. This type of connection places less pressure on the wearer's ear canal and decreases the force vector that pushes the audio device out of the wearer's ear canal.

Additional details of sealing structure 108 are described in U.S. patent application Ser. No. 17/371,483 filed Jul. 9, 2021, the entire contents of which are incorporated by reference herein for all purposes.

In aspects, the in-ear audio output device, described with respect to FIG. 1, includes electronic processing hardware. The electronic processing hardware preferably includes one or more electronic signal processing components, such as radio electronics that are involved in the transmission and reception of wireless signals and an audio processor that is involved with converting and processing coded wireless payload signals to audio signals. The electronic processing hardware may be an FPC (or a partially flexible PCB or rigid PCB) with one or more of such electronic components and potentially other digital or analog components mounted thereon.

Figure 2A:
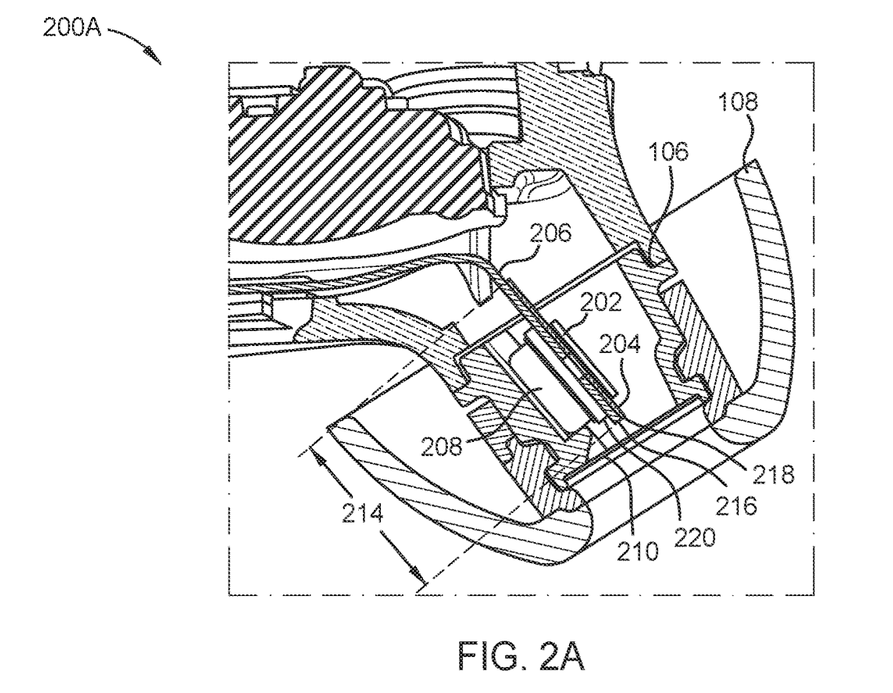
FIG. 2A is a cross-sectional view of a nozzle of the in-ear audio output device illustrating components of the in-ear audio output device positioned within the nozzle.
Figure 2B:
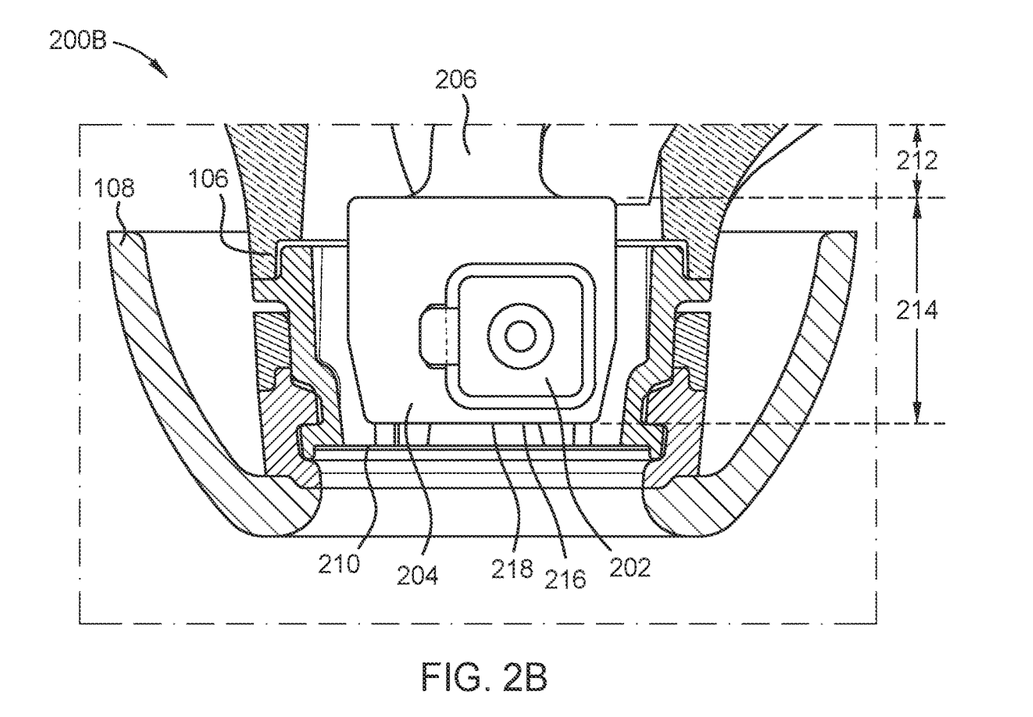
FIG. 2B is a top perspective of components of the in-ear audio output device positioned within the nozzle.

In certain aspects, the FPC may be positioned within earbud housing 104 and nozzle 106. In other words, the FPC may be bent to fit within the desired shape of the in-ear audio output device. FIG. 2A is a cross-sectional view 200A of nozzle 106 of the audio device illustrating components of the audio device positioned within nozzle 106, including the FPC. FIG. 2B is a top perspective 200B of components of the audio device positioned within the nozzle. FIGS. 2A and 2B illustrate an audio device which may not provide adequate ESD protection for a microphone positioned within the audio device.

As illustrated in FIGS. 2A and 2B, similar to FIG. 1, the audio device includes an earbud housing 104 and a nozzle 106. Nozzle 106 includes a planar, distal end having one or more apertures to conduct sound waves to an ear canal of a wearer of the in-ear audio output device. The audio device includes a substantially spherical dome shaped sealing structure 108 extending from the planar, distal end of the nozzle. In certain aspects, the audio device may further include a nozzle metal mesh 210 covering the aperture(s) of nozzle 106. Nozzle metal mesh 210 may be used to prevent dust and moisture from entering nozzle 106. Nozzle metal mesh 210 may also, in some cases, be used to slow the charge of static electricity entering nozzle 106 prior to discharge to a closest metal within nozzle 106.

In certain aspects, an FPC 206 may be shaped to fit within earbud housing 104 and nozzle 106. In particular, FPC 206 may be a soft and flexible material thereby allowing FPC 206 to be bent into any desirable shape to meet design requirements of the audio device. FPC 206 may include a first portion 212 (not entirely illustrated in FIGS. 2A and 2B) and a second portion 214. Second portion 214 of FPC 206 may include a first edge 216. First edge 216 may be proximate the one or more apertures of nozzle 106. First edge 216 may be the portion of FPC 206 closest to the one or more apertures (e.g., first edge 216 may be closer to the one or more apertures of nozzle 106 than any other edge of FPC 206), or in other words, closest to the outside world.

FPC 206 may be a PCB with polyimide, polyester film, or rigid epoxy as a base material. In certain aspects, FPC 206 may include a metal layer above the base material. In other words, FPC 206 may include a metal layer as one of the top layers of, at least, the second portion 214 of FPC 206 (the base material and metal layer of FPC 206 are not separately illustrated in FIGS. 2A and 2B). As described above, to prevent the metal layer from being torn when FPC 206 is punched out of an FPC panel, the metal layer may be pulled back from edges of a top surface of second portion 214 of FPC 206. Accordingly, the surface area of the metal layer (e.g., within second portion 214) may be less than a surface area of the top surface of second portion 214 of FPC 206. Further, an edge of the metal layer (referred to herein as the second edge) may be a greater distance from the nozzle opening than an edge of the In certain aspects, the metal layer consists of copper. Copper may be chosen for use due to its superior electrical and thermal conductivity, strength, corrosion resistance, as well as other advantageous properties.

In certain aspects, FPC 206 may include a top coverlay. The top coverlay may be a top layer of FPC 206 positioned on a top surface of the metal layer of FPC 206. The top coverlay may be a solid sheet of polyimide, or any other suitable material, with a layer of flexible adhesive. A surface area of the top coverlay over second portion 214 may be equal to a surface area of second portion 214 of other layers of FPC 206 such that edges of the top coverlay are aligned with edges of second portion 214 of other layers (excluding pulled back metal layers) of FPC 206.

In other words, a surface area of the top coverlay may be greater than a surface area of the metal layer of FPC 206. The metal layer of FPC 206 may be completely covered by the top coverlay, such that an edge (e.g., closest to the nozzle's opening) of the top coverlay is closer to the outside world, as compared to an edge (e.g., closest to the nozzle's opening) of the metal layer of FPC 206. The top coverlay may serve as a solder resists for FPC 206. Further, the top coverlay may be used to protect the metal layer of FPC 206 from environmental effects, and insulate the metal electrically. In certain aspects, FPC 206 may similarly include a bottom coverlay as a bottom layer of FPC 206. The top coverlay, the bottom coverlay, and the metal layer are collectively illustrated as FPC 206 in FIGS. 2A and 2B.

In certain aspects, the audio device further comprises a microphone surrounded by a metal casing 208. The microphone surrounded by metal casing 208 may be attached to an outer surface (e.g., the bottom coverlay) of FPC 206, such that the microphone is completely enclosed within walls of metal casing 208 and FPC 206. The microphone surrounded by metal casing 208 may be mounted to a bottom surface of FPC 206 such that the microphone surrounded by metal casing 208 is opposite the side of FPC 206 containing the metal layer. Further, as described in more detail below, the microphone surrounded by metal casing 208 may be mounted to a bottom surface of FPC 206 such that the microphone surrounded by metal casing 208 is opposite the side of FPC 206 where a metal stiffener 204 is mounted.

In certain aspects, the microphone surrounded by metal casing 208 may be a micro-electromechanical systems (MEMS) microphone. A MEMS microphone is an electro-acoustic transducer housing a sensor and an application-specific integrated circuit (ASIC) in a single package. The sensor converts variable incoming sound pressure to capacitance variations that the ASIC transforms into analog or digital output. Advantages of using a MEMS microphone in the audio device include its small size for integration, high sound quality, reliability, and affordability.

Metal casing 208, surrounding the microphone, may include an edge (referred to herein as third edge 220) proximate the one or more apertures. Third edge 220 may be closer to the one or more apertures of nozzle 106 than any other edge of metal casing 208. A length of metal casing 208 may be less than a length of second portion 214 of FPC 206.

In some cases, due to location tolerance, the microphone surrounded by metal casing 208 may be attached near a center (e.g., horizontally and vertically) of the bottom surface (e.g., the bottom coverlay) of FPC 206. Thus, third edge 220 of metal casing 208 surrounding the microphone may be a greater distance from opening(s) of nozzle 206 as compared to first edge 216 of FPC 206.

However, because the metal layer of FPC 206 does not extend to the edges of FPC 206 and is covered by the top coverlay, the metal layer of FPC 206 does not help to divert an ESD strike away from metal casing 208 (e.g., because the metal layer of FPC 206 is not at first edge 216 of FPC 206). Instead, static electricity which enters the audio device through one or more apertures of nozzle 106 may be attracted to metal casing 208, as third edge 220 of metal casing 208 is the closest metal in distance to the one or more apertures of nozzle 106.

As mentioned, in some designs, a metal stiffener 204 may be laminated with conductive adhesive on top of the top coverlay of FPC 206 and connected to the ground through openings in the top coverlay. For example, after punching FPC 206 from an FPC panel, a manufacturer may attach a metal stiffener 204 to a top surface of FPC 206. A manufacturer may seek to line up an edge (referred to herein as fourth edge 218) of metal stiffener 204 (e.g., proximate the one or more apertures) with first edge 216 of FPC 206 such that metal stiffener 204 is the closest metal within the audio device to the one or more apertures (e.g., to divert static electricity away from the microphone). For example, a manufacturer may seek to make fourth edge 218 of metal stiffener 204 substantially parallel with first edge 216 of FPC 206. However, due to inaccuracies in placement of metal stiffener 204, there exists a likelihood that fourth edge 218 of metal stiffener 204 exists a greater distance than third edge 220 of metal casing 208 such that metal casing 208 is still the target of an ESD strike.

Further as mentioned, in some designs, a metal mesh 202 may be positioned on a top surface of metal stiffener 204. Although not shown in FIGS. 2A and 2B, metal mesh 202 may be positioned such that metal mesh 202 is the closest metal material to the opening(s) of nozzle 106. Thus, metal mesh 202 may be used to, at least, help in diverting undesirable charge away from metal casing 208 the microphone. However, this may not be a desirable design alternative as metal mesh 202 may constrict airflow, which in turn, may negatively impact acoustic performance of the audio device.

Accordingly, aspects of the present disclosure provide an alternative design which helps to protect the microphone from an ESD strike. In particular, instead of pulling back the metal layer of FPC 206 prior to punching FPC 206, the metal layer may be cut with a laser prior to punching (or other methods of manufacturer may be used) such that edges of the metal layer align with edges of other layers of FPC 206, excluding a top coverlay. In particular, the top coverlay may be positioned on a top surface of the metal layer such that a portion of the metal layer of FPC 206 proximate the one or more apertures remains exposed (e.g., is not covered by the top coverlay). Given this design, the exposed metal layer of FPC 206 may always be a closest metal to the outside world, such that static electricity is attracted to the exposed metal layer instead of metal casing 208 surrounding the microphone. The exposed metal layer may be electrically grounded such that an ESD strike avoids the microphone entirely, thereby providing ESD protection to the audio device, and more specifically, the microphone positioned therein.

Figure 3A:
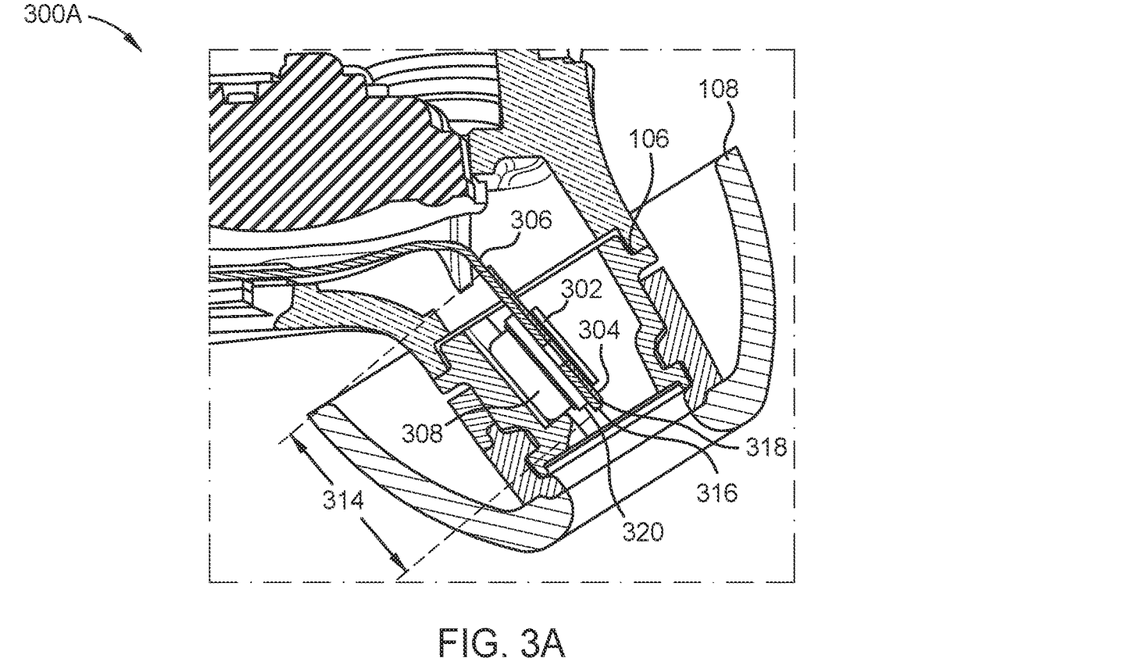
FIG. 3A is a cross-sectional view of a nozzle of the in-ear audio output device illustrating components of the in-ear audio output device positioned within the nozzle for ESD mitigation, according to aspects of the present disclosure.
Figure 3B:
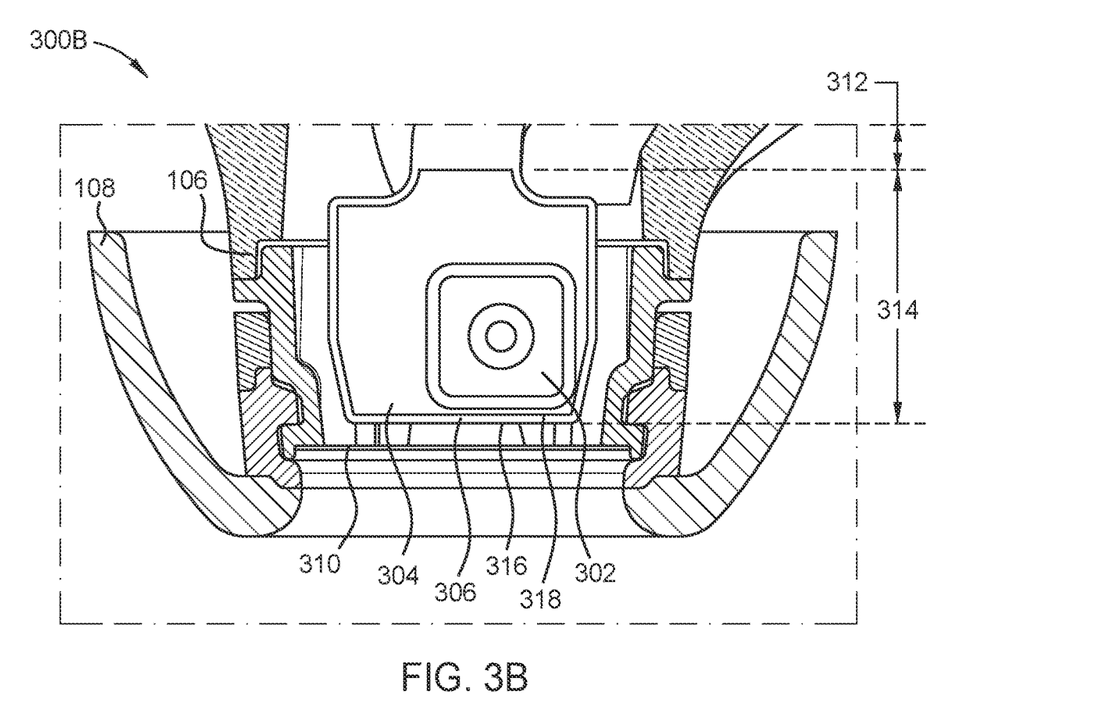
FIG. 3B is a top perspective of components of the in-ear audio output device positioned within the nozzle for ESD mitigation, according to aspects of the present disclosure.

FIG. 3A is a cross-sectional view of the nozzle of the audio device illustrating components of the audio device strategically positioned within the nozzle for ESD mitigation. FIG. 3B is a top perspective of components of the in-ear audio output device strategically positioned within the nozzle for such ESD mitigation.

Components (e.g., such as earbud housing 104, nozzle 106, sealing structure 108, metal mesh 302, metal casing 308 surrounding the microphone, and nozzle metal mesh 310) of the audio device illustrated in FIGS. 3A and 3B may be similar to components (e.g., including earbud housing 104, nozzle 106, sealing structure 108, metal mesh 202, metal casing 208 surrounding the microphone, and nozzle metal mesh 210) illustrated and described with respect to FIGS. 2A and 2B. However, FPC 306, and more specifically the metal layer and top coverlay of FPC 306, illustrated in the audio device of FIGS. 3A and 3B may be different than the metal layer and top coverlay of FPC 206 illustrated in the audio device of FIGS. 2A and 2B.

In particular, as shown in FIG. 3B, the metal layer on a top surface of second portion 314 of FPC 306 may completely cover second portion 314 of FPC 306. In other words, unlike FIGS. 2A and 2B, the metal layer may not be pulled back from edges of second portion 314 of FPC 306, but instead, edges of the metal layer may align with edges of second portion 314 of FPC 306. Accordingly, a first edge 316 of FPC 306 may include the metal layer.

Further, a top coverlay of second portion 314 of FPC 306, unlike the top coverlay of second portion 214 of FPC 206, may have a surface area less than a surface area of the metal layer of FPC 306 (e.g., below the top coverlay), such that the metal layer of FPC 306 is exposed. The coverlay in FIGS. 3A and 3B may be offset from the first edge 316 of FPC 306 such that an edge of the coverlay, referred to herein as second edge 318, is a further distance from opening(s) in nozzle 106 than first edge 316 of FPC 306. Second edge 318 may be closer to the one or more apertures of nozzle 106 than any other edge of the top coverlay. The exposed metal layer, not covered by the top coverlay, may be protected from oxidation by a conductive surface finish such as nickel, gold, tin, or silver.

In certain aspects, second edge 318 may align with fourth edge 318 of metal stiffener 304. Thus, in FIGS. 3A and 3B, second edge 318 of the coverlay and fourth edge 318 of metal stiffener 304 may be collectively represented by edge 318. In certain other aspects, not shown in FIGS. 3A and 3B, the second edge of the coverlay and the fourth edge of metal stiffener 304 may not be aligned (e.g., the second edge of the coverlay may be further or closer to nozzle 106's opening than the fourth edge of metal stiffener 304).

As described with respect to FIGS. 2A and 2B, the metal casing 308 surrounding the microphone may be positioned on a bottom surface (e.g., on a bottom coverlay) of FPC 306 such that a third edge 320 of metal casing 308 (e.g., proximate nozzle 106's opening(s)) is separated from first edge 316 of FPC 306 by a distance greater than zero. Accordingly, irrespective of the selected distance, first edge 316 of FPC 306 may always be a closer metal to nozzle 106's opening(s), as compared to third edge 320 of metal casing 308. Because first edge 316 contains a metal contact, e.g., the metal layer, static electricity which enters the audio device through nozzle 106's opening(s) may be attracted to first edge 316 of FPC 306, and thus, diverted away from metal casing 308.

Figure 4:
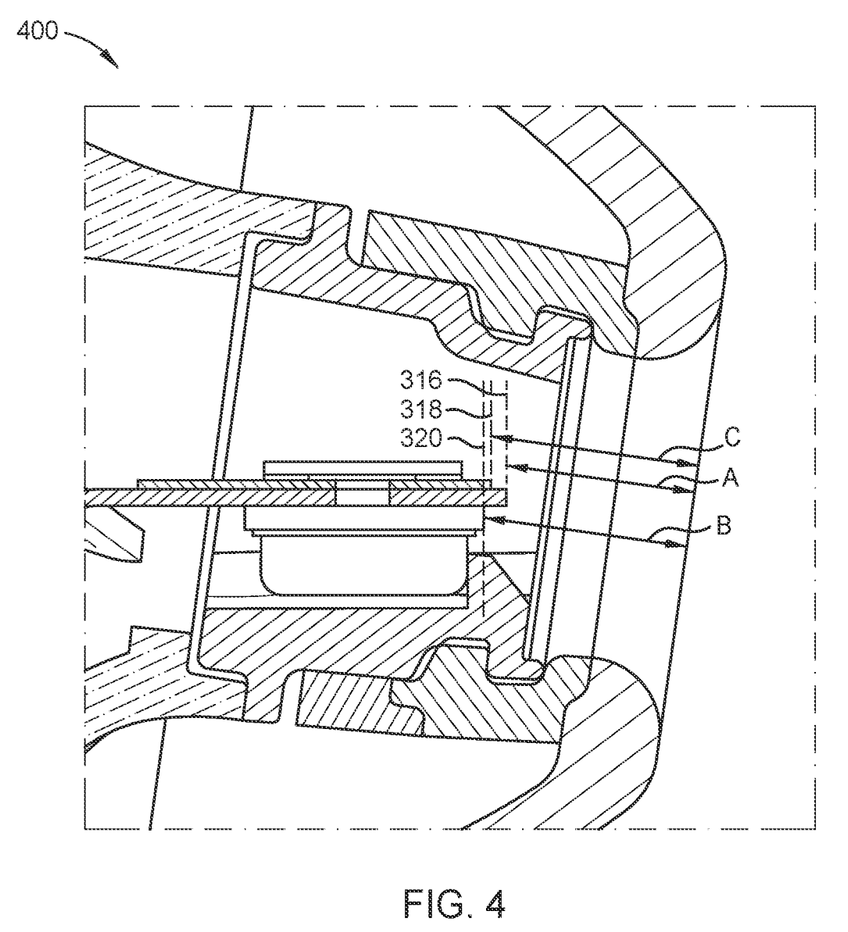
FIG. 4 is a side perspective illustrating distances from one or more openings of the in-ear audio output device to different components positioned within the nozzle, according to aspects of the present disclosure.

FIG. 4 is a side perspective 400 illustrating distances from opening(s) of nozzle 106 to first edge 316 of FPC 306 including the metal layer of FPC 306, second edge 318 of metal stiffener 304 (and similarly the coverlay of FPC 306), and third edge 320 of metal casing 308 surrounding the microphone. In particular, distance A may represent a distance from opening(s) of nozzle 106 to first edge 316 of FPC 306 (excluding the top coverlay of FPC 306), distance B may represent a distance from opening(s) of nozzle 106 to third edge 320 of metal casing 308 surrounding the microphone, and distance C may represent a distance from opening(s) of nozzle 106 to second edge 318 of metal stiffener 304 (and similarly the coverlay of FPC 306, given, in this example, the coverlay and metal stiffener 304 are positioned such that their edges are aligned). Although the in-ear audio output device illustrated in FIG. 4 illustrates an edge of the coverlay of FPC 306 and an edge of metal stiffener 304 (collectively referred to herein as second edge 318) parallel and in-line, in certain other embodiments, the edge of the coverlay of FPC 306 may be closer to or further away from nozzle 106's opening than second edge 318 of metal stiffener 304.

As illustrated, a value of distance A may always be greater than a value of distance B and a value of distance C. In some cases, a value of distance B may be greater than a value of distance C (e.g., where tolerances between FPC 306 and metal stiffener 304 are not adequate to hold metal stiffener 304 in place). In some cases, a value of distance C may be greater than a value of distance B (e.g., where tolerances between FPC 306 and metal stiffener 304 are adequate to hold metal stiffener 304 in place).

Accordingly, because distance A may always be greater than a value of distance B and a value of distance C, and because first edge 316 of FPC 306 at distance A includes the exposed metal layer (e.g., the exposed copper), a static charge entering nozzle 106 may leap from a user to FPC 306, as opposed to third edge 320 of metal casing 308. In other words, FPC 306 (including the metal layer) may be used to divert an ESD strike away from metal casing 308 for purposes of protecting a microphone surrounded by metal casing 308 from an ESD strike.

The in-ear audio output device described herein is applicable to a variety of devices, including audio headphones, hearing aids, hearing assistance headphones, noise-masking earbuds, ANR headphones, aviation headphones, and other devices that include an in-ear component.

Numerous uses of and departures from the specific apparatus and techniques disclosed herein may be made without departing from the inventive concepts. Consequently, the invention is to be construed as embracing each and every novel feature and novel combination of features disclosed herein and limited only by the spirit and scope of the appended claims.

What is claimed is:

1. An in-ear audio output device, comprising:
   an earbud housing;
   a nozzle coupled to an external surface of the earbud housing and configured to extend towards an ear canal of an ear of a wearer of the in-ear audio output device and comprising a planar, distal end having one or more apertures to conduct sound waves to the ear canal of the wearer;
   a flexible printed circuit board positioned within the earbud housing and the nozzle, the flexible printed circuit board comprising:
      a first portion;
      a second portion comprising a first edge of the flexible printed circuit board proximate the one or more apertures;
      a metal layer on a top surface of the second portion extending, at least, to the first edge of the flexible printed circuit board; and
      a first coverlay on a top surface of a portion of the metal layer of the flexible printed circuit board, the first coverlay comprising a second edge proximate the one or more apertures, wherein the second edge is a greater distance away from the one or more apertures than the first edge; and
   a microphone surrounded by a metal casting attached to a bottom surface of the flexible printed circuit board, the metal casing comprising a third edge proximate the one or more apertures, wherein the third edge is a greater distance from the one or more apertures than the first edge.

2. The in-ear audio output device of claim 1, wherein the third edge is a greater distance away from the one or more apertures than the second edge.

3. The in-ear audio output device of claim 1, wherein:
   the flexible printed circuit board further comprises a second coverlay on a bottom surface of the flexible printed circuit board; and
   the microphone surrounded by the metal casing is attached to the second coverlay.

4. The in-ear audio output device of claim 3, wherein the first coverlay and the second coverlay comprise polyimide.

5. The in-ear audio output device of claim 1, wherein the metal layer comprises a copper layer.

6. The in-ear audio output device of claim 1, wherein the metal layer is electrically grounded.

7. The in-ear audio output device of claim 1, further comprising:
   a metal stiffener on a top surface of the first coverlay of the flexible printed circuit board comprising a fourth edge proximate the one or more apertures, wherein the fourth edge is a greater distance away from the one or more apertures than the first edge.

8. The in-ear audio output device of claim 7, wherein the fourth edge is a same distance away from the one or more apertures as the second edge.

9. The in-ear audio output device of claim 1, wherein:
   a length of the metal casing surrounding the microphone is less than a length of the second portion of the flexible printed circuit board; and
the metal casing surrounding the microphone is centered on the bottom surface of the flexible printed circuit board such that the first edge of the flexible printed circuit board and the third edge of the metal casing are separated by a distance.

10. The in-ear audio output device of claim 1, further comprising:
   a metal mesh near the one or more apertures, wherein the metal mesh minimizes an electrostatic discharge entering through the one or more apertures.

11. The in-ear audio output device of claim 1, further comprising:
   a substantially spherical dome shaped sealing structure extending from the planar, distal end of the nozzle.

* * * * *